United States Patent

Cesar

Patent Number: 5,197,902
Date of Patent: Mar. 30, 1993

[54] TERMINATION ADAPTOR CONNECTOR DEVICE

[75] Inventor: Charles Cesar, Saint Martin d'Heres, France

[73] Assignee: Bull S.A., Paris, France

[21] Appl. No.: 705,653

[22] Filed: May 24, 1991

[30] Foreign Application Priority Data

May 30, 1990 [FR] France ................... 90 06692

[51] Int. Cl.⁵ .................................. H01R 9/07
[52] U.S. Cl. ........................ 439/492; 439/395; 439/77
[58] Field of Search .......... 439/67, 77, 492–499, 439/395, 422, 423, 421, 329, 427, 516; 174/117 F, 117 FF

[56] References Cited

U.S. PATENT DOCUMENTS

| | | | |
|---|---|---|---|
| 3,335,393 | 8/1967 | Anderson | 439/427 |
| 3,359,529 | 12/1967 | McKee | 439/427 |
| 4,418,239 | 11/1983 | Larson et al. | 439/492 |
| 4,573,752 | 3/1986 | Rich | 439/77 |
| 4,902,236 | 2/1990 | Hasircoglu | 439/77 |
| 4,913,656 | 4/1990 | Gordon et al. | 439/67 |

FOREIGN PATENT DOCUMENTS

| | | | |
|---|---|---|---|
| 669570 | 12/1964 | Canada | 439/498 |
| 259082 | 3/1988 | European Pat. Off. | |
| 2577353 | 2/1985 | France. | |
| 2613539 | 4/1987 | France. | |

*Primary Examiner*—David L. Pirlot
*Attorney, Agent, or Firm*—Kerkam, Stowell, Kondracki & Clarke

[57] ABSTRACT

Tis termination adaptor connector is provided to receive bulky adaptation and/or simulation elements (4) when there is limited space for the connector and comprises a flexible printed circuit (3) to carry the elements (4) and connect them to the connector (2). The linkage between the connector (2) and the circuit (3) is obtained by means of slit self-stripping connections (6) carried by the same connector, which lock the conductive ends (31) of the circuit (3) in associated slits (60). The entire assembly can then be contained inside a small housing.

20 Claims, 3 Drawing Sheets

TERMINATION ADAPTOR CONNECTOR DEVICE

FIELD OF THE INVENTION

The present invention relates to a termination adaptor connector, including among other elements a package or housing. A connector of a first type is accommodated in the housing and intended to be connected to the end of a line over which signals travel of an electronic system having a connector of a second type, for adapting the line and/or simulating the connection between the line and an external device effectively accommodated in the package. Means for supporting and linking adaptation and/or simulation elements is connected to the connector of the first type.

BACKGROUND OF THE INVENTION

Termination adaptor connectors are currently used to test or adapt an electronic system, or to simulate its connection to some other electronic system. Examples of such devices may be found in electronic components catalogs, more particularly for connectors, published by the manufacturers, such as 3M or AMP. To terminate a line, it is presently usual to use small-sized connector packages, which may include jumper links, electric wires, or adaptation resistors. However, if integration with the connector packages of circuits or bulkier elements is desired, then rigid printed circuits welded to the connectors are used, and the bulky elements are disposed on these circuits. Taking into account the relative bulk of the printed circuit and the elements carried by it, this necessitates the use of equally bulky connector packages, which may have serious disadvantages. There is in fact a strong tendency toward miniaturization at present. Thus current electronic systems are incorporated in smaller and smaller volumes, and if connector packages such as those described above must be used, it becomes impossible in many situations because of lack of space to connect the connector packages, or at least to connect them without disconnecting the electronic systems to be tested.

Another disadvantage in using connector packages of the type described above relates to the difficulty of obtaining effective shielding, because to improve the shielding necessitates a further increase in volume.

OBJECT AND SUMMARY OF THE INVENTION

The object of the present invention is to effectively overcome the various disadvantages discussed above, by a device that is very simple to use, offers very good performance, and is of reduced cost.

To attain this, the termination adaptor connector of the present invention is notable in that the support and linking means is a flexible printed circuit. Linkage between the connector of the first type and the flexible printed circuit is obtained by means of slit self-stripping connections carried by the connector, which perforate the insulation, when present, of the flexible printed circuit and clasp or capture the conductive ends of the flexible printed circuit, which are especially adapted to this end, in the slits provided in the self-stripping connections.

Thus the concept of the invention is to use a flexible printed circuit, which by its flexibility makes it possible, in the simplest possible manner, to fully utilize the volume inside the connector package while effectively supporting even bulky elements. Implementation of this concept thus achieves a very significant gain in space.

Furthermore, in association with the flexible printed circuit, the self-stripping connections allow easy, heavyduty use, and the risk of circuit detachment is averted, since no other welding is necessary. Finally, effective shielding can be attained without difficulty and without increasing the volume, because of the use of a flexible printed circuit, taking into account its intrinsic properties on the one hand and on the other hand the fact that ground planes or lines can be easily integrated into the thickness of the insulator when the printed circuit is made.

In one essential characteristic of the device of the invention, the conductive ends of the flexible printed circuit are remarkable in that they are not covered with insulation and they have a predetermined width, as a function of the width of the slits of the self-stripping connections. The width of the conductive ends are slightly greater than the width of the slits, so as to assure a forced connection when the connections pierce the flexible printed circuit. In this way, each self-stripping connection perforates the insulation, if any, on either side of this conductive end, while the conductive end is clasped and captured, and can perfectly match the shape of the slit.

It is understood that when the conductive ends protrude freely from any support, so that there is no insulation on either side of each of them, this self-stripping connection can clasp and capture a conductive end directly, without perforation, in such a way that the conductive end matches the shape of the slit. The primary importance of using a flexible printed circuit the conductive ends of which protrude free of any support is the greater ease of adapting the flexible printed circuit to any connector; in that case, the flexibility of the conductive end is further improved.

Also characteristically, the ends of the flexible printed circuit are remarkable in that they have a thickness that is at least twice as great as the thickness of the other conductive portions of the flexible printed circuit.

Furthermore, in an additional characteristic, at least two conductive ends, which may or may not be adjacent, can be connected to one another by means of conductive ink and metallized holes. The conductive ink may be disposed in the thickness of the insulator transversely to the conductive lines, while the linkage between conductive lines and conductive ink is obtained selectively by means of selective placement of metallized holes. This makes it easy to make a linkage between lines and also to further improve the shielding when a plurality of ground lines are connected to one another at a common point just upstream of the conductive ends.

According to one embodiment of the invention, the flexible printed circuit may also form a loop, the two ends of which are connected to the connector. This makes it possible to insert the adaptation and/or simulation elements inside the loop, which may also have the effect of improving shielding while guaranteeing a major gain in space and great ease of insertion into the package.

To further improve the flexibility and ease of insertion into the package, the flexible printed circuit, when it has the shape of a loop, may be provided with two transverse cutouts along the same axis, on either side of its median portion, each cutout extending over approximately one-third the width of the flexible printed circuit and ending inside the circuit in a circular recess, in such a manner as to avert any extension of the transverse cutouts.

In order to receive the adaptation and/or simulation elements, the flexible printed circuit is provided with conductor sites that are not covered with insulation, making it easier to affix the adaptation or simulation elements by means of soldering.

Finally, in a final characteristic of the device according to the invention, the conductive ends and the conductor sites not covered with insulation of the flexible printed circuit may be protected at the time of manufacture by an antioxidant compound, for example, an alloy of lead and tin deposited by tinning.

The following description in conjunction with the accompanying drawings, all of them given by example, will enable better comprehension of the invention.

BRIEF DESCRIPTION OF THE DRAWING

FIG. 2a shows one exemplary embodiment of a flexible printed circuit, while

DESCRIPTION OF THE PREFERRED EMBODIMENTS

Figure 1A:
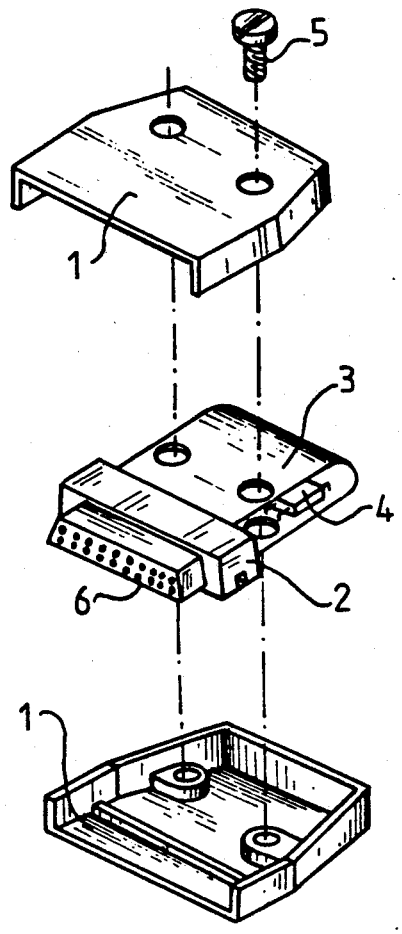
FIG. 1a shows an example of the termination adaptor connector according to the invention.

FIG. 1a proposes an exemplary, non-limiting embodiment of a termination adaptor connector, for which the concept of the invention is used and implemented. The connector device includes a connector package or housing 1 comprising an upper portion and a lower portion. Housing 1 may be any commercially available package. Use of commercially prefabricated housings has the advantage of avoiding special adaptation or machining of this part. Accommodated in the package is a connector 2 of a first type (for instance, female), intended to be connected to the end of a line of an electronic system having a connector (not shown) of a second type (for example, male, if the connector of the first type is female), over which signals pass, for adapting this line and/or simulating its connection to an external device. Also accommodated in the housing 1 and connected to the connector 2 is the means 3 for support and linkage of adaptation and/or simulation elements 4. The upper and lower parts of the housing 1 are joined by way of a fasteners 5 (a screw, bolt, clip, etc).

Figure 1B:
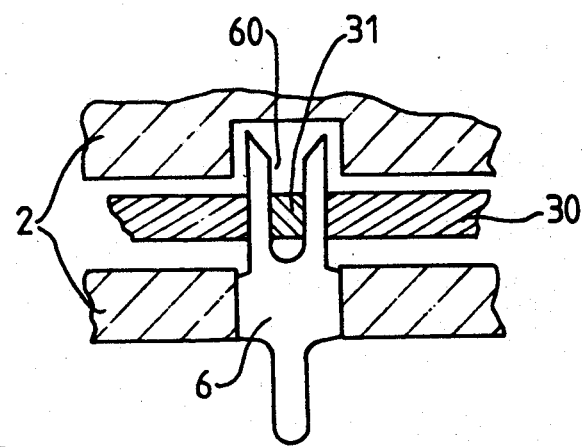
FIG. 1b shows a detail relating to the linkage between a flexible printed circuit and a self-stripping connection.

In accordance with the concept of the invention, the support and linkage means 3 is a flexible printed circuit, the linkage of which with the connector 2 is obtained by means of self-stripping slit connections 6 carried by the connector 2 (for example, self-stripping connections made by the 3M Corporation). As FIG. 1b shows, a self-stripping connection 6 perforates the insulation 30 (which is present in this particular example) of the flexible printed circuit 3 and clasps the conductive end 31 of the flexible printed circuit 3 in the U-shaped slit 60, this end 31 being especially adapted for this purpose. To this end, the conductive ends 31 of the flexible printed circuit 3 are not covered with insulation and have a predetermined width, as a function of the width of the slits of the self-stripping connections 6 and hence as a function of which such connections are selected. Thus the width of the conductive ends must be slightly greater than the width of the U-shaped slits, to assure a forced connection when the connection comes to clasp the conductive end in its slit, which consequently guarantees high-quality contact and also serves to capture or imprison the conductive end.

Figure 2A:
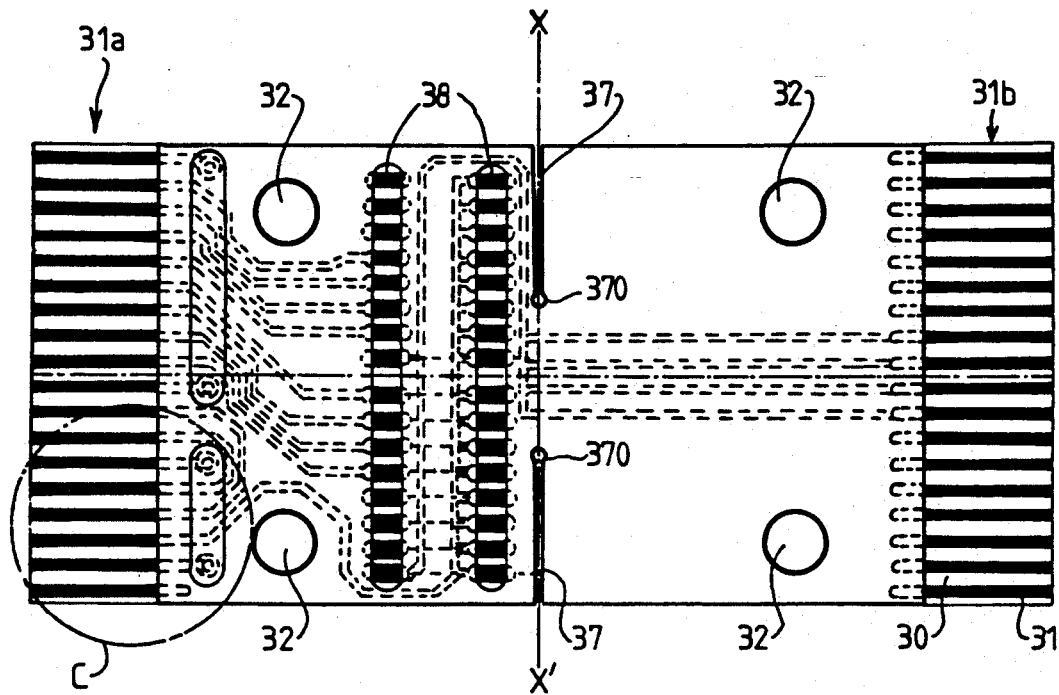

FIG. 2a shows an exemplary embodiment of a flexible printed circuit, the insulation of which may comprise Kapton (trademark registered by E. I. DuPont de Nemours and Company), Upilex (trademark registered by Ube Industries, Inc.), or any other material having similar characteristics. In a known manner, the flexible printed circuit comprises copper links or tracks, having a thickness of approximately 100 $\mu$m, covered with one or more insulating layers on both sides. These copper tracks make it possible to connect the adaptation and/or simulation elements (see FIG. 3) to the conductive ends 31.

Thirty-six conductive ends 31a and 31b are shown in the drawing, eighteen of them, (31a) on one side of the circuit 3 and eighteen (31b) on its other side. Accordingly, such a circuit will be associated with a connector that has thirty-six contacts in two rows and hence thirty-six self-stripping connections. For the case where the fasteners 5 of the two parts of the connector package 1 (FIG. 1a) are screws or bolts, four holes 32 are made in the flexible printed circuit 3 to enable the passage of these fasteners.

Figure 2B:
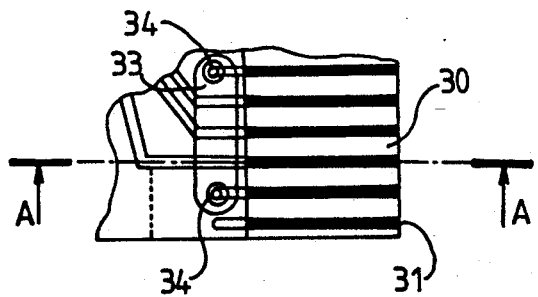
FIGS. 2b and 2c show details of a circled portion of the embodiment of an outlined portion of FIG. 2a, and FIG. 3 shows an embodiment of the flexible printed circuit provided with adaptation and/or simulation elements.
Figure 2C:
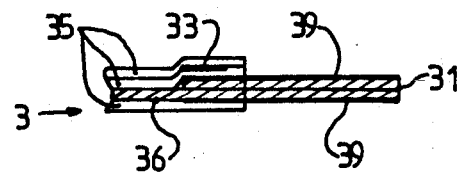

To allow better understanding of the structure of the flexible printed circuit 3, an enlargement of this circuit, in the zone outlined by the circle C (FIG. 2a) is shown in FIG. 2b, and FIG. 2c shows a section taken along the lines AA of the portion shown in FIG. 2b without insulation 30, covering ends 31. As shown in FIG. 2c each conductive end of the flexible printed circuit 3 may have a thickness at least twice as great, for example, being on the order of 250 $\mu$m, as the thickness of the other conductive parts (the thicknesses of which are approximately 100 $\mu$m) of the circuit 3. Furthermore, it can be seen that as has been noted above, the conductive ends 31 are not covered with insulation.

FIGS. 2b and 2c also make it possible to see how two conductive ends 31, which may or may not be adjacent (in FIG. 2b, they are not adjacent), may be connected to one another by means of a linkage of conductive ink 33 and metallized holes 34. The conductive ink is disposed in the thickness of the insulator (in FIG. 2c, it is disposed between two insulation layers 35) transversely to the conductor lines 36, while the linkage between conductor lines 36 and conductive ink 33 is selectively obtained by means of metallized holes 34. A layer of conductive ink may be made, for example, by screen-printing using an ink that contains silver.

In a preferred embodiment of the device according to the invention, the flexible printed circuit 3 forms a loop, shown in FIG. 1a, the two ends of which, comprising the conductive ends 31a and 31b, are connected to the connector 2 (FIG. 1a) by means of connections 6.

In this preferred embodiment, to further improve the flexibility and ease of insertion and arrangement of the flexible printed circuit in the package 1 (FIGS. 1a), this circuit 3 is provided with two transverse cutouts 37 on either side of its middle portion and extending along the same axis xx', each cutout extending over approximately one-third the width of the flexible printed circuit 3 and ending inside the circuit in a circular recess 370.

Finally, the flexible printed circuit 3 is provided with conductor sites 38 that are exposed and not covered with insulation. These sites are provided to receive the adaptation and/or simulation elements, such as those described in conjunction with FIG. 3. The conductor sites 38 and the conductive ends 31a and 31b may furthermore be protected with an antioxidant compound 39, for example, an alloy of lead and tin that is deposited by tinning at the time the circuit 3 is manufactured, and the thickness of which may be approximately 10 μm.

Figure 3:
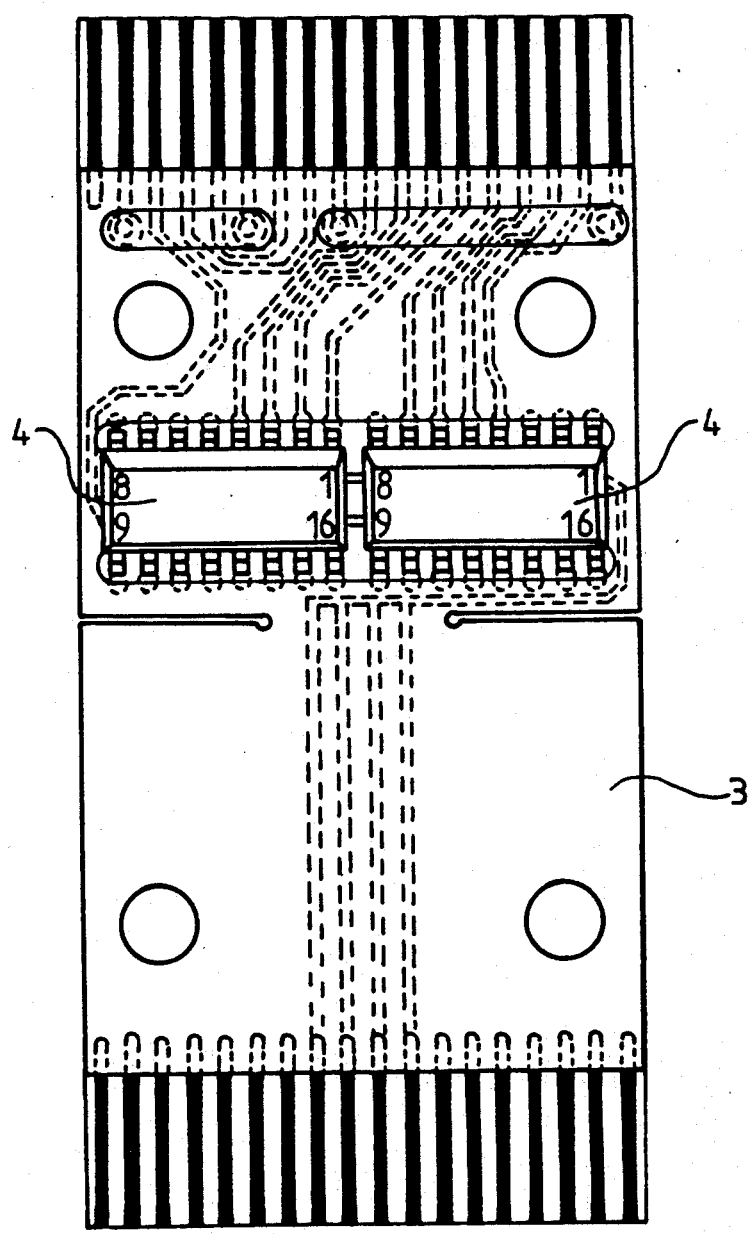

In FIG. 3, the flexible circuit 3, as described in conjunction with FIGS. 2a, 2b, 2c, is shown provided with adaptation and simulation elements 4, which in this exemplary embodiment may be two integrated circuits such as a Texas Instruments ULN 2003D chip, a Motorola MC 1413 D chip, or any equivalent, each including a plurality of npn transistors each equipped with a base resistor and organized in such a manner as to form Darlington assemblies. A termination adaptor connector of this kind makes it possible to adapt and simulate a printer, for instance, at the output of a computer.

In conclusion, because of the increase in space gained by the device according to the invention, it can advantageously be used when the adaptation and/or simulation elements, such as integrated circuits, to be inserted into it are very bulky, and when the space for receiving them is limited. Its cost is less, because a commercially available package can be used without having to be adapted, and it does not require the implementation of complex techniques; on the contrary, it is easy to use. Moreover, it makes it possible to improve shielding in a simple manner, without increasing the volume.

What is claimed is:

1. A termination adaptor connector, comprising a connector of a first type secured in a housing and adapted to be connected to the end of a line over which signals travel of an electronic system having a connector of a second, complementary type, for adapting said line or simulating the connection between the line and an external device, flexible printed circuit means disposed in said housing having exposed conductor sites for supporting and linking adaptation or simulation elements to the connector of the first type, said flexible printed circuit means having a plurality of conductive ends, each of said plurality of conductive ends having two vertical sides, and self-stripping slit connections, each said self-stripping slit connection being carried by said connector of the first type for linking said connector of the first type and the flexible printed circuit means, said self-stripping connections being disposed orthogonally to the flexible printed circuit in order to clasp on both vertical sides of each conductive end of the flexible printed circuit and to capture said conductive ends in associated slits of said self-stripping connections.

2. The termination adaptor connector of claim 1, characterized in that the conductive ends of the flexible printed circuit include a cover layer of insulation and have a predetermined width, which is a function of the width of the slits of the self-stripping connections, the width of the conductive ends being slightly greater than the width of the slits, said self-stripping connections being disposed to perforate said insulation and effect a forced connection with said conductive ends.

3. The termination adaptor connector of claim 2, wherein the flexible printed circuit forms a loop having two ends, the two ends of said loop being connected to the connector.

4. The termination adaptor connector of claim 1, characterized in that the conductive ends of the flexible printed circuit are exposed and have a predetermined width, which is a function of the width of the slits of the self-stripping connections, the width of the conductive ends being slightly greater than the width of the slits, so as to assure a forced connection.

5. The termination adaptor connector of claim 4, wherein the flexible printed circuit forms a loop having two ends, the two ends of said loop being connected to the connector.

6. The termination adapter connector of claim 1, wherein the conductive ends of the flexible printed circuit have a thickness that is at least twice as great as the thickness of other predetermined conductive portions of the flexible printed circuit.

7. The termination adaptor connector of claim 6, wherein the flexible printed circuit forms a loop having two ends, the two ends of said loop being connected to the connector.

8. A termination adaptor connector, comprising a connector of a first type accommodated in a housing and intended to be connected to the end of a line over which signals travel of an electronic system having a connector of a second type, for adapting said line or simulating the connection between the line and an external device also accommodated in the housing, flexible printed circuit means having exposed conductor sites or supporting and linking adaptation or simulation elements to the connector of the first type, self-stripping connections, each said self-stripping connection having slits and being carried by said connector for linking the connector of the first type and the flexible printed circuit, said self-stripping connections being disposed to clasp conductive ends of the flexible printed circuit and capture said conductive ends in associated slits of said self-stripping connections, and wherein the flexible printed circuit forms a loop having two ends, the two ends of said loop being connected to the connector.

9. The termination adaptor connector of claim 1, characterized in that at least two conductive ends are connected to one another by means of conductive ink and metallized holes, the conductive ink being disposed in the thickness of the insulator transversely to the conductive lines, and conductive lines and conductive ink being linked by selective location of said metallized holes.

10. The termination adaptor connector of claim 9, wherein the flexible printed circuit forms a loop having two ends, the two ends of said loop being connected to the connector.

11. The termination adaptor connector of claim 2, characterized in that at least two conductive ends are connected to one another by means of conductive ink and metallized holes, the conductive ink being disposed in the thickness of the insulator transversely to the conductive lines, and conductive lines and conductive ink being linked by selective location of said metallized holes.

12. The termination adaptor connector of claim 11, wherein the flexible printed circuit forms a loop having two ends, the two ends of said loop being connected to the connector.

13. The termination adaptor connector of claim 4, characterized in that at least two conductive ends are connected to one another by means of conductive ink and metallized holes, the conductive ink being disposed in the thickness of the insulator transversely to the conductive lines, and conductive lines and conductive ink being linked by selective location of said metallized holes.

14. The termination adaptor connector of claim 13, wherein the flexible printed circuit forms a loop having two ends, the two ends of said loop being connected to the connector.

15. The termination adaptor connector of claim 6, characterized in that at least two conductive ends are connected to one another by means of conductive ink and metallized holes, the conductive ink being disposed in the thickness of the insulator transversely to the conductive lines, and conductive lines and conductive ink being linked by selective location of said metallized holes.

16. The termination adaptor connector of claim 15, wherein the flexible printed circuit forms a loop having two ends, the two ends of said loop being connected to the connector.

17. A termination adaptor connector, comprising a connector of a first type secured in a housing and adapted to be connected to the end of a line over which signals travel of an electronic system having a connector of a second, complementary type, for adapting said line or simulating the connection between the line and an external device, flexible printed circuit means disposed in said housing for supporting and linking adaptation or simulation elements to the connector of the first type, said flexible printed circuit means having a plurality of conductive ends, each of said conductive ends having two vertical sides, and self-stripping slit connections, each said self-stripping slit connections being carried by said connector of the first type for linking said connector of the first type and the flexible printed circuit, said self-stripping connections being disposed orthogonally to the flexible printed circuit in order to clasp on both vertical sides of each conductive end of the flexible printed circuit and to capture said conductive ends in associated slits of said self-stripping slit connections, wherein the flexible printed circuit forms a loop having two ends, the two ends of said loop being connected to the connector, and wherein the flexible printed circuit is provided with two transverse cutouts along the same axis on either side of a median portion of said fledxible printed circuit, each cutout extending over approximately one-third the width of the flexible printed circuit and ending inside the circuit in a circular recess.

18. The termination adaptor connector of claim 17, wherein the flexible printed circuit includes exposed conductor sites adapted to receive the adaptation or simulation elements.

19. The termination adaptor connector of claim 1, wherein the flexible printed circuit includes exposed conductor sites adapted to receive the adaptation or simulation elements.

20. The termination adaptor connector of claim 19, characterized in that the conductive ends and the conductor sites include a protective layer of an antioxidant compound.

* * * * *

UNITED STATES PATENT AND TRADEMARK OFFICE
CERTIFICATE OF CORRECTION

PATENT NO. : 5,197,902
DATED : March 30, 1993
INVENTOR(S) : Charles CESAR

It is certified that error appears in the above-indentified patent and that said Letters Patent is hereby corrected as shown below:

On the Title Page, Item [57];
In the Abstract, line 1, "Tis" should be --This--;

Column 6, line 25 (Claim 8, line 8) "or" should be --for--.

Signed and Sealed this

Twenty-first Day of June, 1994

*Attest:*

BRUCE LEHMAN

*Attesting Officer*     *Commissioner of Patents and Trademarks*